United States Patent
Gurr et al.

(10) Patent No.: US 7,019,524 B2
(45) Date of Patent: Mar. 28, 2006

(54) METHOD, SYSTEM AND COMPUTER PRODUCT FOR K-SPACE CORRECTION OF GRADIENT NON-LINEARITIES

(75) Inventors: David H. Gurr, Palo Alto, CA (US); Jean H. Brittain, Palo Alto, CA (US); John M. Pauly, Redwood City, CA (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 253 days.

(21) Appl. No.: 10/147,665

(22) Filed: May 17, 2002

(65) Prior Publication Data

US 2003/0214291 A1 Nov. 20, 2003

(51) Int. Cl.
*G01V 3/00* (2006.01)

(52) U.S. Cl. ...................................................... 324/314
(58) Field of Classification Search ................. 324/307, 324/309; 600/410
See application file for complete search history.

(56) References Cited

U.S. PATENT DOCUMENTS

| | | | | |
|---|---|---|---|---|
| 4,663,591 A | * | 5/1987 | Pelc et al. ................... | 324/309 |
| 5,402,067 A | | 3/1995 | Pauly et al. | |
| 5,498,963 A | * | 3/1996 | Schneider et al. ........... | 324/309 |
| 5,644,646 A | * | 7/1997 | Du et al. ..................... | 382/128 |
| 5,825,185 A | * | 10/1998 | Liu et al. ..................... | 324/309 |
| 5,832,922 A | * | 11/1998 | Schotland ................... | 600/407 |
| 5,886,524 A | * | 3/1999 | Krieg .......................... | 324/312 |
| 6,066,949 A | | 5/2000 | Alley et al. | |
| 6,150,815 A | * | 11/2000 | Janzen et al. ................ | 324/309 |
| 6,198,283 B1 | * | 3/2001 | Foo et al. .................... | 324/309 |
| 6,242,914 B1 | | 6/2001 | Yoshitome | |
| 6,246,239 B1 | * | 6/2001 | Krogmann et al. .......... | 324/318 |
| 6,331,776 B1 | * | 12/2001 | Debbins et al. ............. | 324/309 |
| 6,341,179 B1 | * | 1/2002 | Stoyle et al. ................ | 382/254 |
| 6,353,752 B1 | * | 3/2002 | Madore et al. .............. | 600/410 |
| 6,380,738 B1 | * | 4/2002 | Zhou ........................... | 324/309 |
| 6,385,478 B1 | * | 5/2002 | Hajnal ......................... | 600/410 |
| 6,538,443 B1 | * | 3/2003 | Morich et al. ............... | 324/318 |
| 6,541,973 B1 | * | 4/2003 | Danby et al. ................ | 324/318 |
| 6,566,877 B1 | * | 5/2003 | Anand et al. ................ | 324/314 |
| 6,671,536 B1 | * | 12/2003 | Mistretta .................... | 600/410 |
| 2001/0004211 A1 | | 6/2001 | Ookawa | |
| 2001/0027262 A1 | | 10/2001 | Mistretta et al. | |

FOREIGN PATENT DOCUMENTS

| | | |
|---|---|---|
| EP | 0 965 855 A2 | 12/1999 |
| EP | 1024371 B1 | 1/2004 |

OTHER PUBLICATIONS

PCT Search Report for EP 03 25 3028.
Hiroyuki Kudo et al.; "Reconstruction of Magnetic Resonance Images by Iterative Methods;" Systems and Computers in Japan, vol. 23, No. 3, 1992; pp. 62–74.
David G. Kruger et al.; "Continuously Moving Table Data Acquisition Method for Long FOV Contrast–Enhanced MRA and Whole–Body MRI;" Magnetic Resonance in Medicine 47:224–231 (2002).

* cited by examiner

*Primary Examiner*—Brij Shrivastav
*Assistant Examiner*—Dixomara Vargas
(74) *Attorney, Agent, or Firm*—Cantor Colburn LLP

(57) ABSTRACT

One aspect of the invention is a method for reconstructing a moving table MR image. The method comprises receiving an input array that includes a plurality of uncorrected k-space data points. The method further comprises clearing a summation array. For uncorrected k-space data points in the input array the following steps are performed. A kernel associated with the k-space data point is obtained. Corrected data is created in response to the k-space data point, the input array and the kernel. Creating the corrected data includes correcting the uncorrected k-space data point for gradient non-linearities, where the correction is performed in k-space, and correcting the uncorrected k-space data point for table movement. The corrected data is added into the summation array. The image is reconstructed in response to the data in the summation array.

23 Claims, 3 Drawing Sheets

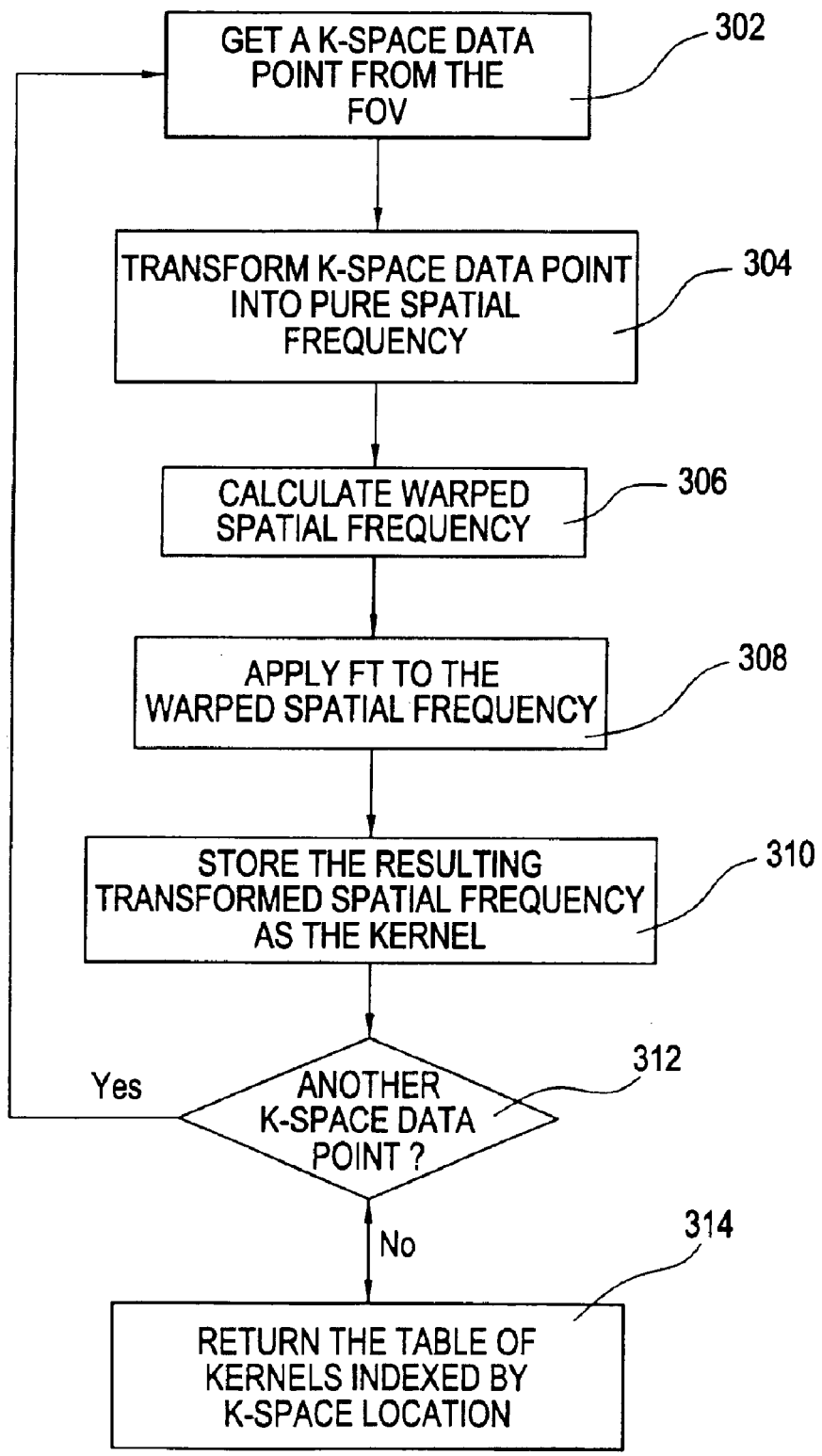

METHOD, SYSTEM AND COMPUTER PRODUCT FOR K-SPACE CORRECTION OF GRADIENT NON-LINEARITIES

BACKGROUND OF THE INVENTION

The field of the invention is nuclear magnetic resonance imaging methods and systems. More particularly, the invention relates to a method for correcting for gradient non-linearities in k-space. It will be appreciated, however, that the invention is also amenable to other like applications.

Magnetic resonance imaging (MRI) is a diagnostic imaging modality that does not rely on ionizing radiation. Instead, it uses strong uniform static magnetic fields, radio-frequency (RF) pulses of energy and magnetic field gradient waveforms. More specifically, MRI is a non-invasive procedure that uses nuclear magnetization and radio waves for producing internal pictures of a subject. Data concerning an area of interest on the subject under investigation is acquired during repetitive excitations of the magnetic resonance (MR) device.

When utilizing MRI to produce images, a technique is employed to obtain MRI signals from specific locations in the subject. Typically, the region that is to be imaged (region of interest) is scanned by a sequence of MRI measurement cycles, which vary according to the particular localization method being used. The resulting set of received nuclear magnetic resonance (NMR) signals are digitized and processed to reconstruct the image using one of many well-known reconstruction techniques. To perform such a scan it is necessary to discriminate NMR signals from specific locations in the subject. This is accomplished by employing gradient magnetic fields denoted $G_x$, $G_y$, and $G_z$. A magnetic field gradient is a variation in the magnetic field with respect to position along the x, y and z axes. By controlling the strength of these gradients during each NMR cycle, the spatial distribution of spin excitation can be altered and the location is encoded in the resulting NMR signals.

MRI uses time-varying gradient magnetic fields to encode spatial position in the received NMR signal. If the gradient fields are linear, it can be shown that the received NMR signal is equal to the value of the Fourier transform of the imaged object at some spatial frequency, and the received signal over time maps to a trajectory through spatial-frequency space, or k-space. The trajectory path is determined by the time integral of the applied gradient waveforms. Each data point of the NMR signal indicates the phase and amplitude of a spatial frequency and a full experiment yields a set of observed data points that specify the NMR image as the sum of these weighted spatial frequencies. More succinctly, a complete set of MRI data samples k-space sufficiently to allow reconstruction of the imaged object via the inverse Fourier transform. This relation between received NMR signal and spatial-frequency space has led to the development of the theory of Fourier imaging which has been applied to and forms the basis of much of NMR imaging.

Fourier imaging relies on linear gradients. Truly linear gradient magnetic fields are infeasible due to constraints on physical space within the main magnet, gradient heating limits, and other practical considerations. In practice, gradients are not spatially linear. Using Fourier reconstruction on data acquired with non-linear gradients can result in image artifacts. Non-linear gradients can cause a spatially variant image distortion and a low-frequency amplitude modulation. If the perturbation from a linear field is known, then the distortion and the modulation can be corrected. The modulation can be corrected by multiplying the resulting images by the inverse of the modulation function. The distortions can be corrected by generating a new image based on values interpolated from the original image. This image-based correction of gradient non-linearity is known as gradwarp and is described in Glover et al. in U.S. Pat. No. 4,591,789. It requires not only that the gradient non-linearity be known, but that it be temporally constant over the course of an experiment. One situation where this approach does not work is the reconstruction of NMR data from a sample that is moving through the MRI system. In this case, although the non-linearity is constant relative to the magnet coordinates, the non-linearity varies relative to the sample coordinates (and thus the image coordinates) as the sample moves through regions of varying gradient linearity.

Stepped or continuous table motion can be used to image a field of view (FOV) larger than the region of instrument sensitivity. Data acquired at different table positions, can be combined to form a single image. Any variations in gradient linearity in the direction of table motion will result in image artifacts. Typically, these artifacts are avoided by limiting data acquisition to the most linear region of the gradient fields. This restriction limits the maximum table velocity. If the limits on data acquisition could be relaxed, scan times could be reduced significantly. Traditional image domain methods to correct for gradient non-linearities are incompatible with the moving table methods since data is acquired at a range of table positions.

BRIEF DESCRIPTION OF THE INVENTION

One aspect of the invention is a method for reconstructing a moving table MR image. The method comprises receiving an input array that includes a plurality of uncorrected k-space data points. The method further comprises clearing a summation array. For uncorrected k-space data points in the input array the following steps are performed. A kernel associated with the uncorrected k-space data point is obtained. Corrected data is created in response to the uncorrected k-space data point, the input array and the kernel. Creating the corrected data includes correcting the uncorrected k-space data point for gradient non-linearities, where the correction is performed in k-space, and correcting the uncorrected k-space data point for table movement. The corrected data is added into the summation array. The image is reconstructed in response to the data in the summation array.

Another aspect of the invention is a method for reconstructing a moving table MR image. The method comprises receiving an input array that includes a plurality of uncorrected k-space data points. The image of the sample is reconstructed in response to the plurality of uncorrected k-space data points and is derived by the formula:

$$m(r) = FT^{-1}\left\{\sum_{t \in T} M'(j(t))((\exp[i2\pi(q'(t) \cdot k)]S(k)) * (\exp[i2\pi(p(t) \cdot k)]B_{j(t)}(k))0\right\}.$$

$FT^{-1}$ is the inverse Fourier transform, $M'(j(t))$ is one of said plurality of uncorrected k-space data points written in j-space form, $q'(t)$ is the position of the sample at time t minus the position of a coil at time t, k is the k-space data point, $S(k)$ is a sensitivity factor, $p(t)$ is the position of the sample at time t, and $B_{j(t)}(k)$ is a kernel associated with the uncorrected k-space data point.

Another aspect of the invention is a system for reconstructing a MR image. The system comprises a MRI system that includes at least one gradient coil, at least one RF coil, a moving table and an input array that includes a plurality of uncorrected k-space data points. The system also comprises a computer system in communication with the MRI system including application software to implement a method. The method comprises receiving said input array and clearing a summation array. For uncorrected k-space data points in the input array the following steps are performed. A kernel associated with the uncorrected k-space data point is obtained. Corrected data is created in response to the uncorrected k-space data point, the input array and the kernel. Creating the corrected data includes correcting the uncorrected k-space data point for gradient non-linearities, where the correction is performed in k-space, and correcting the uncorrected k-space data point for table movement. The corrected data is added into the summation array. The image is reconstructed in response to the data in the summation array.

A further aspect of the invention is a system for reconstructing a MR image. The system comprises a computer system that includes application software to implement a method. The method comprises receiving an input array that includes a plurality of uncorrected k-space data points. The method further comprises clearing a summation array. For uncorrected k-space data points in the input array the following steps are performed. A kernel associated with the uncorrected k-space data point is obtained. Corrected data is created in response to the uncorrected k-space data point, the input array and the kernel. Creating the corrected data includes correcting the uncorrected k-space data point for gradient non-linearities, where the correction is performed in k-space, and correcting the uncorrected k-space data point for table movement. The corrected data is added into the summation array. The image is reconstructed in response to the data in the summation array.

A further aspect of the invention is a computer program product for reconstructing a MR image. The computer product comprises a storage medium readable by a processing circuit and storing instructions for execution by the processing circuit for performing a method that comprises receiving an input array that includes a plurality of uncorrected k-space data points. The method further comprises clearing a summation array. For uncorrected k-space data points in the input array the following steps are performed. A kernel associated with the uncorrected k-space data point is obtained. Corrected data is created in response to the uncorrected k-space data point, the input array and the kernel. Creating the corrected data includes correcting the uncorrected k-space data point for gradient non-linearities, where the correction is performed in k-space, and correcting the uncorrected k-space data point for table movement. The corrected data is added into the summation array. The image is reconstructed in response to the data in the summation array.

Further aspects of the invention are disclosed herein. The above discussed and other features and advantages of the present invention will be appreciated and understood by those skilled in the art from the following detailed description and drawings.

BRIEF DESCRIPTION OF THE DRAWINGS

Referring to the exemplary drawings wherein like elements are numbered alike in the several Figures:

FIG. 3 is an exemplary process for pre-computing kernels.

DETAILED DESCRIPTION OF THE INVENTION

Figure 1:
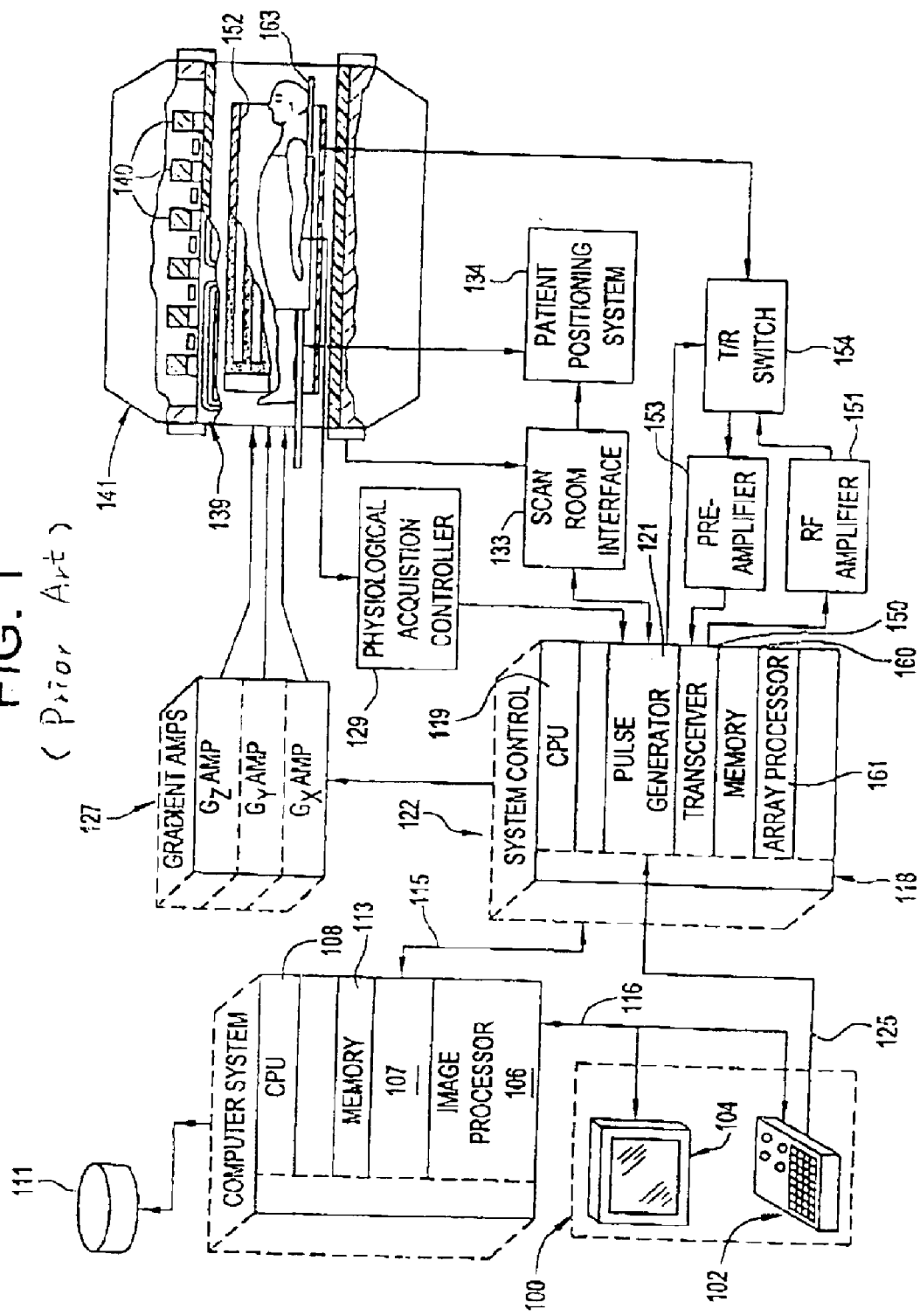
FIG. 1 is a block diagram of an exemplary MRI system which employs the present invention.

FIG. 1 is a block diagram of an exemplary MRI system which employs the present invention. Shown in FIG. 1 are the major components of an exemplary MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a storage device 111 for storage of image data and programs, and it communicates with a separate system control 122 through a network connection such as a high speed serial link 115.

In an exemplary embodiment, the system control 122 includes a set of modules connected together by a backplane. These include a CPU module 119 and a pulse generator module 121 which connects to the operator console 100 through a network connection such as a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. It is also through the scan room interface circuit 133 that a patient positioning system 134 receives commands to move the patient to the desired position for the scan. In an exemplary embodiment of the present invention, the patient is positioned on a table 163 that is moving continuously at a constant velocity. A number of image fields, or sub-Field of Views (FOVs) taken of the patient as the table 163 is moving may be combined to form a whole body image.

The gradient waveforms produced by the pulse generator module 121 are applied to a gradient amplifier system 127 comprised of Gx, Gy and Gz amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and one or more RF coils 152. The polarizing magnet 140, gradient coils 139, and RF coils 152 cover a portion of the patient's body at one time. For example, the largest image field, or sub-FOV, may be forty-eight centimeters because it may only be possible to get a signal from a forty-eight centimeter volume in the center of the polarizing magnet 140. In order to make whole body images using a continuously moving table 163 and a number of sub-FOVs, the reconstruction of the image combines the data to form a single consistent image without discontinuities. A transceiver module 150 in the system control 122 produces pulses that are amplified by an RF amplifier 151 and coupled to one or more RF coils 152 by one or more transmit/receive switches 154. The resulting signals radiated by the excited nuclei in the patient may be sensed by the same RF coil(s) 152 and coupled through the transmit/receive switch(es) 154 to a preamplifier 153. The amplified NMR signals are demodulated, filtered, and digitized in the receiver section of the transceiver 150. The transmit/receive switch(es) 154 is controlled by a signal from the pulse generator module 121 to electrically connect the RF amplifier 151 to the coil(s) 152 during the transmit mode and to connect the preamplifier 153 during the receive mode. The transmit/receive switch(es) 154 also enables a separate RF coil(s) (for example, a head coil or surface coil) to be used in either transmit or receive mode.

The NMR signals picked up by the RF coil(s) 152 are digitized by the transceiver module 150 and transferred to a memory module 160 in the system control 122. As the scan is completing and subarrays of data from the subFOVs are acquired in the memory module 160, the image is reconstructed in accordance with the teachings of the present invention. In moving table acquisitions, the array of data can be broken down into a number (e.g., 20) of sub-FOVs. Each sub-FOV is made up of a number (e.g., 256 in the case of 2D imaging or 4,096 (256×16) for 3D imaging) of individual frames. In an exemplary embodiment a frame could be made up of two hundred and fifty-six (256) data points. In response to commands received from the operator console 100, the image data may be archived on the tape drive 112, or it may be further processed by the image processor 106 and conveyed to the operator console 100 and presented on the display 104.

Figure 2:
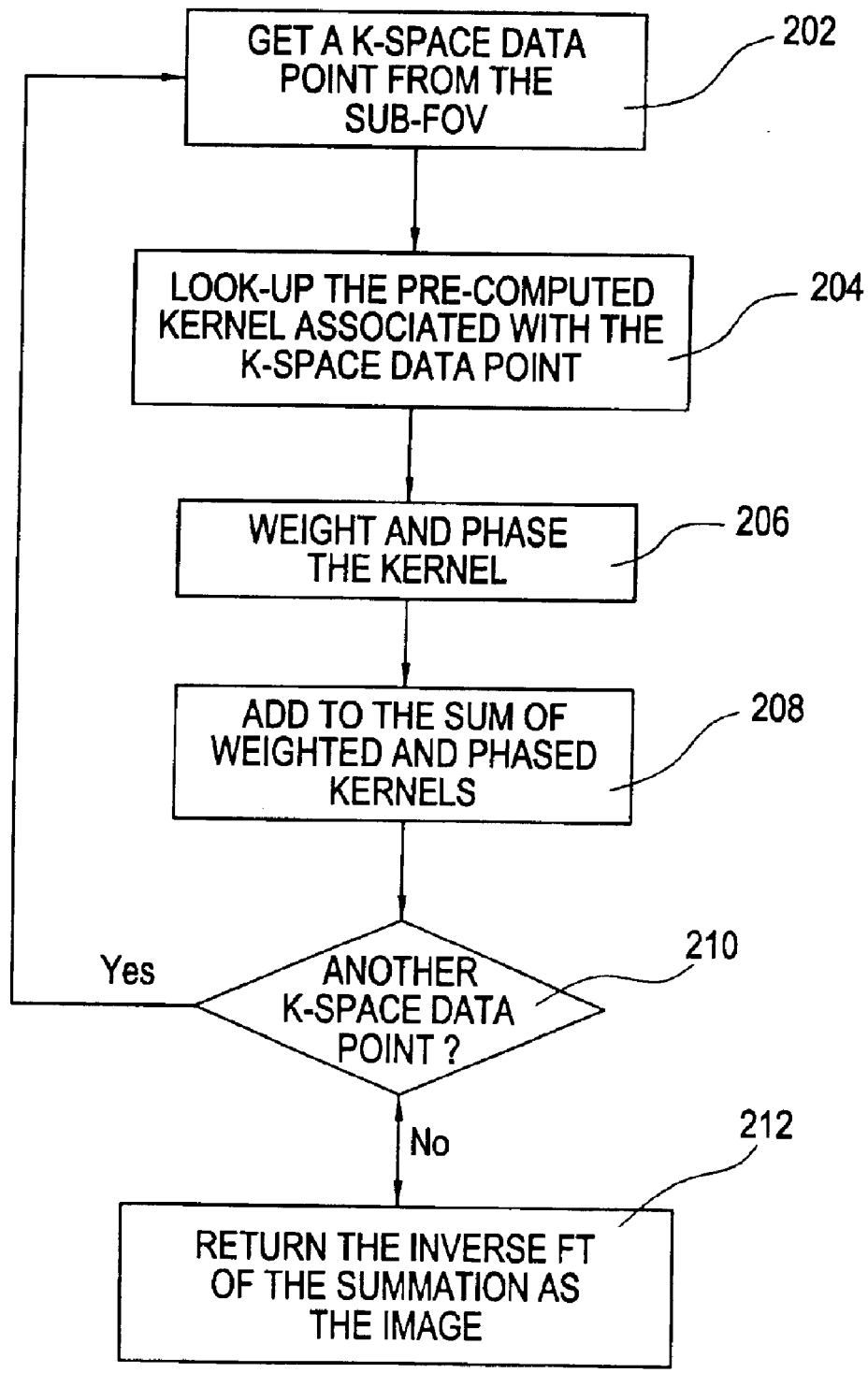
FIG. 2 is an exemplary process for correcting for non-linear gradients in k-space.

An exemplary embodiment of the present invention is depicted in FIG. 2. FIG. 2 includes a k-space based correction method that is compatible with moving-table algorithms. First, the following assumptions are made:

(1) r is a position vector representing space in the image domain and represented as r=<x,y,z>;
(2) m(r) is the spin density of an object to be imaged and represented as m(r)=m(x,y,z)∈ Image; and
(3) the Fourier transform of the spin density of an object to be imaged is represented as M(k)=M(kx,ky,kz).

In addition, the assumption that the gradients are linear is relaxed and the assumption is made that the gradient strength as a function of space and time can be expressed as:

$$G(r,t)=g_x(t)G_x(r)+g_y(t)G_y(r)+g_z(t)G_z(r)$$

where $g_x(t)$ is the current applied by the amplifier 127 to the x gradient as a function of time t and $G_x(r)$ is the strength of gradient of the x gradient as a function of position r. And likewise for the y and z gradients.

Since the gradients are no longer assumed to be linear, the encoding functions will no longer be limited to pure spatial frequencies.

In the following formulas the resulting space is referred to as j-space to avoid confusion with standard k-space. A j-space data point is the same as an uncorrected k-space data point. Also, in the following formulas "*" represents the convolution operation and "•" represents a dot product operation. Assuming the following data:

integrals of the gradient wave forms:

$$j_x(t)=(\gamma/2\pi)\int_0^t g_x(t')dt',$$

$$j_y(t)=(\gamma/2\pi)\int_0^t g_y(t')dt', \text{ and}$$

$$j_z(t)=(\gamma/2\pi)\int_0^t g_z(t')dt'$$

where γ is the gyromagnetic ratio of the particle;

a j-space trajectory:

$$j(t)=<j_x(t),j_y(t),j_z(t)>; \text{ and}$$

an MR signal as a function of the j-space trajectory at a discrete set of times:

$$M'(j(t))|t\in T$$

such that the following equation holds:

$$M'(j(t))=\int m(r)\exp[-i2\pi(j_x(t)G_x(r)+j_y(t)G_y(r)+j_z(t)G_z(r))]dr;$$

where dr is the derivative of position.

The function of the gradients is to perform a spatially dependent modulation of the spins of the object to be imaged. The function of the reconstruction is to create an image by demodulation of the gradient induced modulations. So long as the set of modulation functions:

$$\{b_{j(t)}(r)=\exp[i2\pi(j_x(t)G_x(r)+j_y(t)G_y(r)+j_z(t)G_z(r))]|j(t)=<j_x(t),j_y(t),j_z(t)>,t\in T\}$$

is a basis for Image then m(r) can be constructed from M'(j(t)):

$$m(r) = \sum_{t\in T} M'(j(t))e^{i2\pi(jx(t)Gx(r)+jy(t)Gy(r)+jz(t)Gz(r))} = \sum_{t\in T} M'(j(t))b_{j(t)}(r).$$

Performing a change of basis from the functions $b_{j(t)}(r)$ to their Fourier transformed counterparts $B_{j(t)}(k)$, where $$B_{j(t)}(k) = FT\{b_{j(t)}(r)\}$$

$$= \int b_{j(t)}(r)\exp[-i2\pi k\cdot r]dx$$

results in:

$$M(k) = \sum_{t\in T} M'(j(t))B_{j(t)}(k).$$

The calculation of the corrected image m(r) can be represented mathematically as:

$$m(r) = FT^{-1}\{M(k)\}$$

$$= FT^{-1}\left\{\sum_{t\in T} M'(j(t))B_{j(t)}(k)\right\}$$

where $FT^{-1}$ is the inverse Fourier transform function. The corrected image, m(r) can be stored in the storage device 111.

This calculation of m(r) can be implemented by an embodiment of the present invention using the process depicted in FIG. 2. At step 202, an uncorrected k-space data point from an array or FOV of observed NMR signals is obtained. Next, at step 204, the pre-computed kernel, $B_{j(t)}(k)$, that is associated with the uncorrected k-space data point is either calculated or looked up in a precomputed table. At step 206, the kernel is weighted and phased by the acquired data at this point in k-space and the current FOV, resulting in the value denoted as M(k). In other words, M(k) is made up of a band of spatial frequencies that are created when the uncorrected k-space data point is regridded with the spatially varying kernel. This process is referred to as applying gradwrap in k-space since it is the k-space dual of applying gradwarp in image space.

One kernel, $B_{j(t)}(k)$, is required for each point in uncorrected k-space. Pre-computing the kernels, with the ability to recall them quickly, can save on computation time. As shown above, the kernels are pre-computed by Fourier transforming the warped spatial frequencies before reconstruction. The kernels are pre-computed based on the expected acquisition dimensions and resolutions. FIG. 3, described below is an exemplary embodiment of a process for pre-computing the kernels.

Referring to FIG. 2, at step 208 the corrected k-space data point, also referred to as the weighted and phased kernel, $M(k)$, is added to the sum of the previous weighted and phased kernels in the FOV. As indicated by step 210, this process of getting an uncorrected k-space data point $M'(j(t))$ at step 202 through adding to the sum of weighted and phased kernels at step 208 is repeated for uncorrected k-space data points within the FOV. At step 212, the inverse Fourier transform of the summation, or the corrected image, $m(r)$, is calculated.

The method described in reference to FIG. 2 can be used to reconstruct an image of a sample moving at a uniform velocity through regions of varying gradient linearity. In an exemplary embodiment, under the assumptions above, assume: the sample is moving such that its position at time t is $p(t)$; and a (potentially moving) coil(s) at position $q(t)$ with limited spatial region of sensitivity $s(r-q(t))$. The observed MR signal is:

$$M'(j(t)) = \int m(r-p(t))s(r-q(t))b_{j(t)}(r)dr$$

If $r'=r-p(t)$, and $q'=p(t)-q(t)$ then:

$$M'(j(t)) = \int m(r')s(r'+q'(t))b_{j(t)}(r'+p(t))dr'.$$

Therefore, $m(r)$ can be reconstructed from $M'(j(t))$ as follows:

$$m(r) = \sum_{t \in T} M'(j(t))s(r' + q'(t))b_{j(t)}(r' + p(t))$$

Again, performing a change of basis from $b_{j(t)}(r)$ to $B_{j(t)}(k)$ where:

$$(\exp[i2\pi(q'(t)\cdot k)]S(k))*(\exp[i2\pi(p(t)\cdot k)]B_{j(t)}(k)) = FT\{s(r+q'(t))b_{j(t)}(r+p(t))\},$$

where $(\exp[i2\pi(p(t)\cdot k)]$ corrects the kernel for the motion, $\exp[i2\pi(q'(t)\cdot k)]S(k)$ is a sensitivity factor, and $B_{j(t)}(k)$ is the original kernel;
results in:

$$M(k) = \sum_{t \in T} M'(j(t))((\exp[i2\pi(q'(t)\cdot k)]S(k))*(\exp[i2\pi(p(t)\cdot k)]B_{j(t)}(k)))$$

and $$m(r) = FT^{-1}\left\{\sum_{t \in T} M'(j(t))((\exp[i2\pi(q'(t)\cdot k)]S(k))*(\exp[i2\pi(p(t)\cdot k)]B_{j(t)}(k)))\right\}.$$

The sensitivity factor is a function of space and accounts for the fact that with moving table reconstruction, the whole sample is not within the region of instrument sensitivity at each point in time. Stationary table acquisitions require one k-space traversal to obtain a FOV that corresponds to one image. In contrast, moving table acquisitions require several k-space traversals to obtain several corresponding sub-FOVs which are combined to make up one image. The values of the kernels are the same for both moving table acquisitions and fixed table acquisitions.

An important point in an exemplary embodiment of this reconstruction technique is the assumption that the modulation functions form a basis for the space of images. This requires two conditions. First, that the subspace of images is a subspace spanned by the set of functions. And second, that the functions be independent. For example, the Nyquist criterion specifies the first condition for the case of linear gradients and "bandwidth limited" objects. As an example of the second condition, acquisition techniques such as non-monotonic gradients and multiple coils can result in modulation and/or sensitivity patterns that are not linearly independent. This second condition can be solved by pre-processing the j-space data and j-space modulation functions to form a linearly independent set of basis functions. The same considerations concerning k-space trajectories and regridding that apply to Fourier imaging apply to this generalization. In the case of moving table imaging, the modulation functions, relative to the object coordinates, must form a basis for the space of images.

In an exemplary embodiment of the present invention a consideration is the size of the convolution kernels. The computational efficiency of this technique relies on the efficient computation of:

$$((\exp[i2\pi(q'(t)\cdot k)]S(k))*(\exp[i2\pi(p(t)\cdot k)]B_{j(t)}(k))).$$

To the extent that the gradients are approximately linear, the functions $b_{j(t)}(r)$ are approximately pure spatial frequencies and thus the functions $B_{j(t)}(k)$ are approximately zero for most of their range. This makes it feasible to pre-compute $B_{j(t)}(k)$ for $t \in T$. Alternatively $B_{j(t)}(k)$ can be simplified as:

$$B_{j(t)}(k) = FT\{b_{j(t)}(r)\}$$
$$= FT\{\exp[i2\pi(j_x(t)G_x(r) + j_y(t)G_y(r) + j_z(t)G_z(r))]\}$$
$$= FT\{\exp[i2\pi j_x(t)G_x(r)]\exp[i2\pi j_y(t)G_y(r)]\exp[i2\pi j_z(t)G_z(r)]\}$$
$$= FT\{\exp[i2\pi j_x(t)G_x(r)]\} * FT\{\exp[i2\pi j_y(t)G_y(r)]\} *$$
$$FT\{\exp[i2\pi j_z(t)G_z(r)]\}$$
$$= B_{x,j(t)}(k) * B_{y,j(t)}(k) * B_{z,j(t)}(k)$$

where $$B_{x,j(t)}(k) = FT\{\exp[i2\pi j_x(t)G_x(r)]\},$$
$$B_{y,j(t)}(k) = FT\{\exp[i2\pi j_y(t)G_y(r)]\}, \text{ and}$$
$$B_{z,j(t)}(k) = FT\{\exp[i2\pi j_z(t)G_z(r)]\}.$$

In an exemplary embodiment of the present invention, these functions can be pre-computed for appropriate values of $j_x(t)$, $j_y(t)$, and $j_z(t)$. Pre-computing these kernels, $B_{x,j(t)}(k)$, $B_{y,j(t)}(k)$ and $B_{z,j(t)}(k)$, and storing them in storage where they can be recalled quickly will save processing time. FIG. 3 is an exemplary embodiment of a process for pre-computing the kernels. At step 302 a k-space data point is acquired from the FOV. The k-space data point is then transformed into its pure spatial frequency by applying the inverse Fourier Transform at step 304. Next, at step 306 the warped spatial frequency is calculated by applying gradwarp to the pure spatial frequency. At step 308 the Fourier transform function is applied to the warped spatial frequency. The resulting transformed warped spatial frequency is stored as the kernel belonging to the k-space data point at step 310. This loop from getting a k-space data point at step 302 through storing the associated kernel at step 310 is performed for k-space data points in the FOV as indicated by step 312. Finally, a table of kernels, indexed by k-space location is returned at step 314.

By pre-computing the kernels, it is possible to acquire and reconstruct images in an efficient manner. The scan time required to image an extended FOV using a continuously moving table is determined by the table velocity. The maximum velocity is limited by the scanner volume that can be utilized for data acquisition. By correcting for gradient non-linearity, useful volume can be expanded and shorter scan times can be achieved.

Since it can be applied in the k-space domain, and since the correction can be chosen on a per data point basis, k-space correction has a wide range of practical applicability. This includes applicability to 2D and 3D moving table imaging. It can also be extended to correct for similar artifacts such as spatially dependent eddy currents (e.g., B0) to which image based gradwarp cannot be applied. Further extensions include, but are not limited to: multiple coils including coils moving relative to the gradients and the object; different numbers of gradients; eddy current corrections via the appropriate $b_{j(t)}(r)$; generalization of motion to include rotation; and a term for receive filters.

Although the preceding embodiments are discussed with respect to medical imaging, it is understood that the image acquisition and processing methodology described herein is not limited to medical applications, but may be utilized in non-medical applications.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. An embodiment of the present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for reconstructing a MR image, the method comprising:

receiving an input array including a plurality of uncorrected k-space data points;

clearing a summation array;

for an uncorrected k-space data point in said input array performing steps that include:
  obtaining a kernel associated with said uncorrected k-space data point from a pre-computed kernel or a look-up table of kernels;
  creating corrected data in response to said uncorrected k-space data point, said input array and said obtained kernel, wherein said creating includes:
    correcting said uncorrected k-space data point for gradient non-linearities, wherein said correcting is performed in k-space; and
    correcting said uncorrected k-space data point for table movement; and
  adding said corrected data into said summation array; and reconstructing the image in response to said summation array.

2. The method of claim 1 wherein said correcting said uncorrected k-space data point for gradient non-linearities includes replacing said uncorrected k-space data point with said kernel that has been weighted and phased in response to said uncorrected k-space data point.

3. The method of claim 1 wherein said correcting said uncorrected k-space data point for table movement includes:

correcting for sensitivity; and correcting for motion.

4. The method of claim 1 wherein said pre-computed kernel is obtained by a method including:

identifying a k-space location that corresponds to said uncorrected k-space data point;

transforming said k-space location into its pure spatial frequency;

calculating a warped spatial frequency in response to said pure spatial frequency; and creating said kernel by applying a Fourier transform to said warped spatial frequency.

5. The method of claim 1, wherein, when said kernel is obtained from said look-up table of kernels, the method further comprises:

identifying an uncorrected k-space trajectory including a plurality of k-space locations; and for a k-space location in said uncorrected k-space trajectory performing steps that include:
  transforming said k-space location into its pure spatial frequency;
  calculating a warped spatial frequency in response to said pure spatial frequency;
  applying a Fourier transform to said warped spatial frequency; and
  storing the result of said applying a Fourier transform in said table of kernels.

6. The method of claim 1 wherein:

said input array includes a plurality of sub-arrays;

said plurality of sub-arrays are reconstructed to form a plurality of sub-images corresponding to each said sub-array; and said plurality of sub-images are combined to form a full image.

7. The method of claim 1 wherein said input array is two dimensional.

8. The method of claim 1 wherein said input array is three dimensional.

9. The method of claim 1 wherein said reconstructing includes applying an inverse Fourier transform to said summation array.

10. The method of claim 1 wherein said creating corrected data includes correcting said uncorrected k-space data point for eddy currents.

11. A method for reconstructing a moving table MR image, the method comprising:
   receiving an input array that includes a plurality of uncorrected k-space data points;
   reconstructing the image of a sample in response to said plurality of uncorrected k-space data points, wherein said reconstructed image is:

$$FT^{-1}\left\{\sum_{t \in T} M'(j(t))((\exp[i2\pi(q'(t) \cdot k)]S(k)) * (\exp[i2\pi(p(t) \cdot k)]B_{j(t)}(k)))\right\}$$

where $FT^{-1}$ is the inverse Fourier transform, $M'(j(t))$ is one of said plurality of uncorrected k-space data points written in j-space form, $q'(t)$ is the position of the sample at time t minus the position of a coil at time t, k is the k-space data point, $S(k)$ is a sensitivity factor, $p(t)$ is the position of the sample at time t, and $B_{j(t)}(k)$ is a kernel associated with the uncorrected k-space data point, said kernel is pre-computed or obtained from a look-up table of kernels.

12. A system for reconstructing a MR image, the system comprising:
   a MRI system including at least one gradient coil, at least one RF coil, a moving table and an input array including a plurality of uncorrected k-space data points; and
   a computer system in communication with said MRI system including application sofiware to implement the method comprising:
      receiving said input array from said MRI system;
      clearing a summation array;
      for an uncorrected k-space data point in said input array performing steps that include:
         obtaining a kernel associated with said uncorrected k-space data point from a pre-computed kernel or a look-up table of kernels;
         creating corrected data in response to said uncorrected k-space data point, said input array and said obtained kernel, wherein said creating includes:
            correcting said uncorrected k-space data point for gradient non-linearities, wherein said correcting is performed in k-space; and
            correcting said uncorrected k-space data point for table movement; and
         adding said corrected data into said summation array; and
      reconstructing the image in response to said summation array.

13. The system of claim 12 wherein said RF coil is moving relative to a gradient and to a subject.

14. The system of claim 12 wherein said moving table moves at a constant velocity.

15. The system of claim 12 wherein said moving table moves in a linear direction.

16. The system of claim 12 wherein said moving table moves in a rotational direction.

17. The system of claim 12 wherein said MRI system and said computer system are in physically separate locations.

18. The system of claim 12 wherein said MRI system and said computer system are in the same physical location.

19. The system of claim 12 wherein said MRI system includes said computer system.

20. The system of claim 12 wherein said MRI system and said computer system are in communication via a network.

21. The system of claim 20 wherein said network is the Internet.

22. A system for reconstructing a MR image, the system comprising:
   a computer system including application software to implement a method comprising:
      receiving an input array including a plurality of uncorrected k-space data points;
      clearing a summation array;
      for an uncorrected k-space data point in said input array performing steps that include:
         obtaining a kernel associated with said uncorrected k-space data point from a pre-computed kernel or a look-up table of kernels;
         creating corrected data in response to said uncorrected k-space data point, said input array and said obtained kernel, wherein said creating includes:
            correcting said uncorrected k-space data point for gradient non-linearities, wherein said correcting is performed in k-space; and
            correcting said uncorrected k-space data point for table movement; and
         adding said corrected data into said summation array; and
      reconstructing the image in response to said summation array.

23. A computer program product for reconstructing a MR image, the product comprising:
   a storage medium readable by a processing circuit and storing instructions for execution by the processing circuit for:
      receiving an input array including a plurality of uncorrected k-space data points;
      clearing a summation array;
      for an uncorrected k-space data point in said input array performing steps that include:
         obtaining a kernel associated with said uncorrected k-space data point from a pre-computed kernel or a look-up table of kernels;
         creating corrected data in response to said uncorrected k-space data point, said input array and said obtained kernel, wherein said creating includes:
            correcting said uncorrected k-space data point for gradient non-linearities, wherein said correcting is performed in k-space; and
            correcting said uncorrected k-space data point for table movement; and
         adding said corrected data into said summation array; and
      reconstructing the image in response to said summation array.

* * * * *